United States Patent
Nouri et al.

(10) Patent No.: US 7,236,917 B1
(45) Date of Patent: Jun. 26, 2007

(54) METHOD AND APPARATUS FOR GENERATING MINIMAL NODE DATA AND DYNAMIC ASSERTIONS FOR A SIMULATION

(75) Inventors: Nasser Nouri, San Jose, CA (US); William K. Lam, Newark, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 633 days.

(21) Appl. No.: 10/699,076

(22) Filed: Oct. 31, 2003

(51) Int. Cl.
*G06F 17/50* (2006.01)
(52) U.S. Cl. ........................................................ 703/14
(58) Field of Classification Search ................... 703/14, 703/15; 716/15, 16
See application file for complete search history.

(56) References Cited

U.S. PATENT DOCUMENTS

| | | | |
|---|---|---|---|
| 5,297,057 A * | 3/1994 | Kramer et al. .................. 703/7 |
| 6,154,719 A * | 11/2000 | Saitoh et al. .................. 703/13 |
| 6,457,162 B1 * | 9/2002 | Stanion ........................ 716/7 |
| 6,763,505 B2 * | 7/2004 | Baumgartner et al. ......... 716/5 |
| 6,877,053 B2 * | 4/2005 | Lahiri et al. ................. 710/113 |
| 7,086,023 B2 * | 8/2006 | Visweswariah ................ 716/6 |

* cited by examiner

*Primary Examiner*—Albert W. Paladini
(74) *Attorney, Agent, or Firm*—Osha Liang LLP

(57) ABSTRACT

A system for tracing a simulation design involves an encoded assertion asserting a value of a node of the simulation design at a point in a simulation, a fanin cone detection facility configured to obtain a fanin cone for the encoded assertion, a waveform trace facility configured to obtain waveform data including a history of signal values for the node, and a simulation toolkit configured to obtain node data using the fanin cone and the waveform data.

26 Claims, 8 Drawing Sheets

METHOD AND APPARATUS FOR GENERATING MINIMAL NODE DATA AND DYNAMIC ASSERTIONS FOR A SIMULATION

BACKGROUND OF INVENTION

Modern high performance electronic circuitry has an ever-increasing number of circuit elements and an ever-rising clock frequency. As circuitry performance continues to increase, the result has been a larger number of circuits switching at faster rates. After a circuit prototype is initially manufactured and failure modes are uncovered, determining failure mechanisms is time intensive due to the increased circuit complexity. Circuit failures may be the result of logic errors or poor manufacturability of a circuit element. In both cases, simulation of the circuit helps to confirm or refute the existence of a logic error and verify the correctness of the design.

Simulation may occur at low levels of abstraction, e.g., at a "switch-level." Switch-level simulations typically include active circuit elements (e.g., transistors) and passive circuit elements (e.g., resistors, capacitors, and inductors). CPU simulation also may occur at a higher level of abstraction, e.g., a "behavioral level." Behavioral level simulations typically use a hardware description language (HDL) that determines the functionality of a single circuit element or group of circuit elements. Examples of typical behavioral level simulation languages are Very High Speed Integrated Circuit HDL (VHDL) and Verilog. Using Verilog, for example, electronic circuitry is described as a set of modules, each of which is part of a design of a circuit, circuits, or a device. Modules can represent elements of hardware ranging from simple gates to complete systems.

Designers may use assertions to detect design errors and verify design correctness during simulations. An assertion is an expression written in a computer language (in HDL, for example), which asserts that at a certain time during the simulation, a certain signal (or combination of signals) in the design equals a certain value or values. For example, an assertion included in a design may assert that value of an output of a particular gate is equal to "1" at 1000 seconds into the simulation (or at a particular cycle of the simulation, e.g., the $500^{th}$ cycle of the simulation). If the assertion fails, i.e., if the value of an output of the gate is not equal to "1" at 1000 seconds into the simulation, then the simulator in which the simulation is executing may stop, or display a warning, or perform some other appropriate action.

FIG. 1 shows a system for using assertions to detect design errors during a simulation. The system includes a design (20), a compiler (22), a simulation image (24), assertions (26), a connectivity database (28), a simulator (30), a simulation toolkit (32), a waveform trace (34), and node data (36). The design, (e.g., Verilog modules) (20), is compiled by the compiler (22), which generates the simulation image (24), including the assertions (26). The connectivity database (28), also generated by the compiler (22), is typically made available to a designer conducting the simulation via the simulation toolkit (32).

The simulation image (24) is typically a binary executable file including instructions for performing the simulation on a simulator (30). The assertions (26) are a set of instructions (typically written in a high-level computer programming language) asserting the value of circuit elements of the design (20) at particular points in the simulation. For example, the assertions (26) may include an instruction to the simulator (30) to assert that the output of a particular AND gate is equal to "1" 1000 seconds after the start of the simulation. A simulation toolkit (32) is software used by a designer to control the simulation. The simulation toolkit (32) typically includes software to control the other parts of the system, and to obtain and present sufficient data to allow the designer to control the simulation and later debug errors in the design that are uncovered during the simulation. As such, the simulation toolkit (32) may include appropriate Command Line Interface (CLI) and Graphical User Interface (GUI) tools.

The connectivity database (28) provides a connectivity description for the circuit elements of the design (20). The connectivity description describes how the circuit elements are connected to each other. For example, the connectivity database (28) provides a connectivity description describing connections to other circuit elements for the previously mentioned AND gate. For example, the connectivity database (28) describes the AND gate as having two inputs, each of which is a signal driven by a particular circuit element (such as a another gate, etc.), where each circuit element has other inputs. Thus, a circuit element of the design (20) may be represented as a node in a graph, with inputs and outputs of the node represented as edges connecting to other nodes of the design (20).

If an assertion is associated with a particular node, then each set of drivers (e.g., each circuit element providing signal inputs into the node) may be represented as a tree structure called a fanin cone. The root of the fanin cone is the node associated with the assertion. FIG. 2 shows a fanin cone (40) for an assertion (42), which has two drivers, node 1 (44), and node 2 (46). Node 1 (44) has three drivers, node 3 (48), node 4 (50), and node 5 (52). Because node 3 (48), node 4 (50), and node 5 (52) do not have drivers, node 3 (48), node 4 (50), and node 5 (52) are considered primary inputs, and are leaf nodes of the fanin cone (40). Likewise, node 2 (46) has two drivers, node 6 (54) and node 7 (56), which are primary inputs.

Referring back to FIG. 1, during the simulation, the designer uses the simulation toolkit (32) to determine which nodes are drivers of a failed assertion. The designer uses the node data (36) from the waveform trace (34) to determine the cause of the assertion failure. However, the waveform trace (34) includes waveforms (signals) for each of the multiple nodes of the design, which may include thousands of nodes. In order to minimize the amount of node data that the designer uses to debug the assertion failure, the designer may obtain a fanin cone for the particular assertion associated with the assertion failure. Thus, the simulation toolkit may include software for tracing the fanin cone for a failed assertion (using, for example, well-established graph theory algorithms). Next, the designer may obtain minimal node data by selecting only those waveforms from the waveform trace (34) that pertain to the fanin cone.

FIGS. 3 and 4 show a flowchart of operations for a simulation using the system shown in FIG. 1 to verify a design. A first operation is obtaining the design and assertions for the design (Step 80). Then, the assertions are inserted into the design (Step 82). The design is compiled using a compiler to generate a simulation image (Step 84). Compiling the design also generates the connectivity database. The simulation image then is loaded onto a simulator and executed on the simulator (Step 86). During execution, the simulator checks for failed assertions (Step 88), and a determination is made whether an assertion has failed (90).

If an assertion has not failed, the simulation image continues to execute on the simulator (Step 86). Otherwise, as shown in FIG. 4, if an assertion has failed, the simulation is halted (Step 92). Once the simulation is halted, node data for the design is obtained (Step 94). The node data is used to determine the cause of the assertion failure. The node data may include specific values of signals on nodes at particular points of the simulation prior to the failure of the assertion. In order to reduce the number of nodes for which node data is obtained, the designer may use the connectivity database to obtain a fanin cone for the assertion(s) that failed. Thus, the designer may avoid obtaining unnecessary node data (i.e., obtaining node data for nodes that are not drivers for the nodes associated with the assertion that failed).

Once node data is obtained, the designer analyzes the node data to debug the failed assertion (Step 96). For example, the designer may determine that a particular gate associated with a node in the fanin cone is faulty, which caused an unexpected signal value, resulting in the failed assertion. In other cases, the designer may not be able to determine the cause of the failed assertion. For example, the node data obtained by the designer may be incorrect.

A determination is made as to whether the cause of the assertion failure is found (Step 98). If the cause of the assertion failure is found, the design is corrected and recompiled using the simulation toolkit, taking into consideration the cause of the assertion failure (Step 100). Then, a determination is made as to whether the assertions require modification (Step 102). If the assertions require modification, the designer modifies the assertions (Step 104).

Once the assertions are modified (or if modification is not required), a determination is made as to whether the simulation has completed (Step 106). If the simulation has not completed, Step 82 is performed; otherwise, the simulation ends.

Referring back to Step 98 of FIG. 4, if the cause of assertion failure is not found, then the designer modifies the assertions (Step 104), and if the simulation is determined to not be complete (Step 106), the assertion is inserted into the design (typically, by hard coding the modifications to the assertions within the simulation image) (Step 82). The design with the modified assertion is then compiled to generate the simulation image (Step 84). Next, the simulation is restarted and executed on the simulator (Step 86).

If, while the design is being executed on the simulator, the designer wishes to modify the assertions prior to discovering a failure, the designer may use the simulation toolkit to halt the simulation, obtain new assertions (Step 80), insert the new assertions into the design (Step 82), and recompile the design to generate another simulation image (Step 84), which is then loaded onto the simulator once more and executed (Step 86).

SUMMARY OF INVENTION

In general, in one aspect, the invention relates to a system for tracing a simulation design. The system comprising an encoded assertion asserting a value of a node of the simulation design at a point in a simulation, a fanin cone detection facility configured to obtain a fanin cone for the encoded assertion, a waveform trace facility configured to obtain waveform data comprising a history of signal values for the node, and a simulation toolkit configured to obtain node data using the fanin cone and the waveform data.

In general, in one aspect, the invention relates to a method of tracing a simulation design. The method comprising obtaining an assertion for a simulation image of the simulation design, generating hooks into the simulation image using a simulation toolkit to obtain an instrumented simulation image, wherein the hooks are generated based on the assertion, a fanin cone, and waveform data, and executing the instrumented simulation image in a simulation environment to obtain node data from the assertion.

In general, in one aspect, the invention relates to a computer system for tracing a simulation design. The computer system comprises a processor, a memory, a storage device, and software instructions. The software instructions stored in the memory for enabling the computer system to obtain an assertion for a simulation image of the simulation design, generate hooks into the simulation image using a simulation toolkit to obtain an instrumented simulation image, wherein the hooks are generated based on the assertion, a fanin cone, and waveform data, and execute the instrumented simulation image in a simulation environment to obtain node data from the assertion.

In general, in one aspect, the invention relates to an apparatus for tracing a simulation design. The apparatus comprising means for obtaining an assertion for a simulation image of the simulation design, means for generating hooks into the simulation image using a simulation toolkit to obtain an instrumented simulation image, wherein the hooks are generated based on the assertion, a fanin cone, and waveform data, means for executing the instrumented simulation image in a simulation environment to obtain node data from the assertion, and means for debugging the failure of the assertion using the node data.

Other aspects and advantages of the invention will be apparent from the following description and the appended claims.

DETAILED DESCRIPTION

Figure 1:
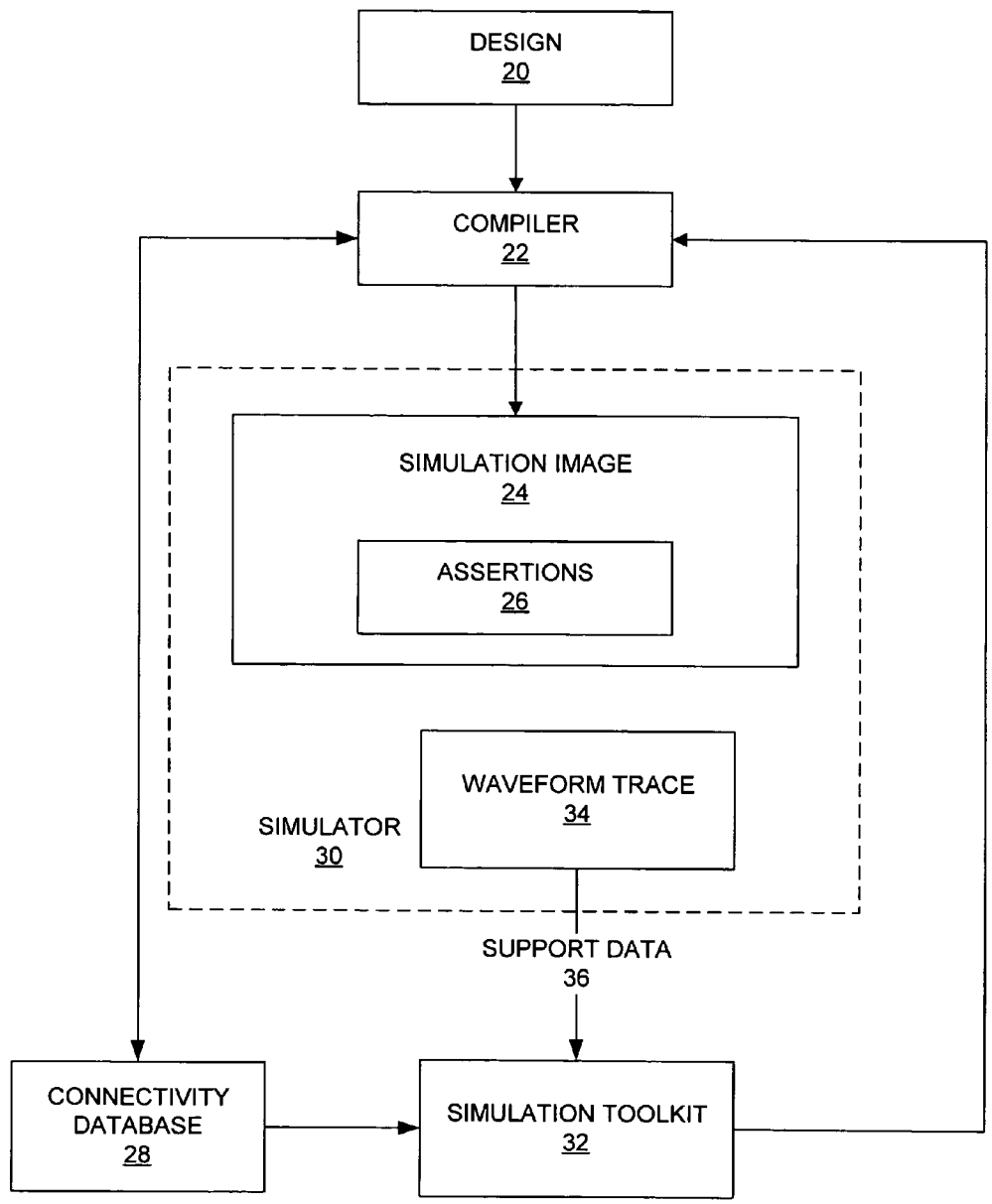
FIG. 1 shows a system for using assertions to detect design errors during a design simulation.

Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 5:
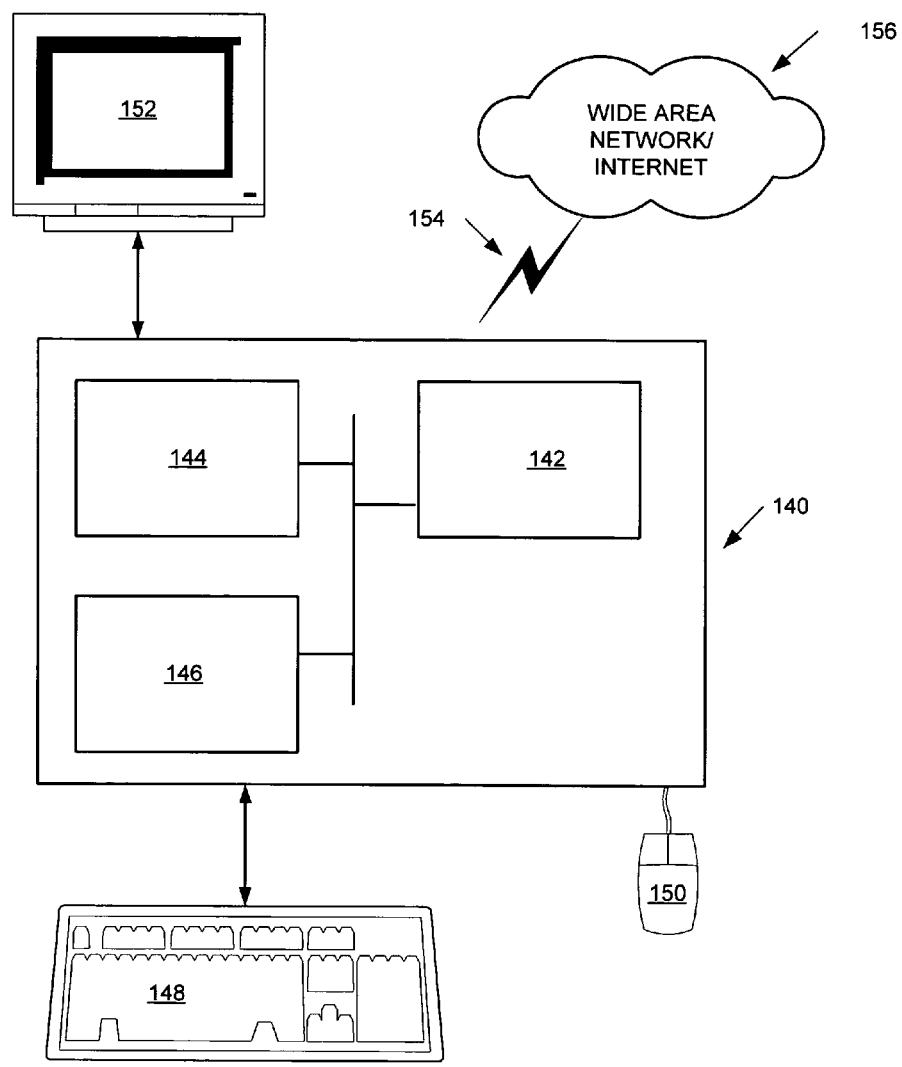
FIG. 5 shows a typical networked computer system.

The invention may be implemented on virtually any type computer regardless of the platform being used. For example, as shown in FIG. 5, a typical computer (140) includes a processor (142), an associated memory (144), a storage device (146), and numerous other elements and functionalities typical of today's computers (not shown). The computer (140) may also include input means, such as a keyboard (148) and a mouse (150), and an output device, such as a monitor (152). Those skilled in the art will appreciate that these input and output means may take other forms in an accessible environment. The computer (140) may be connected via a network connection (154) to a Wide Area Network (WAN) (156), such as the Internet.

Figure 6:
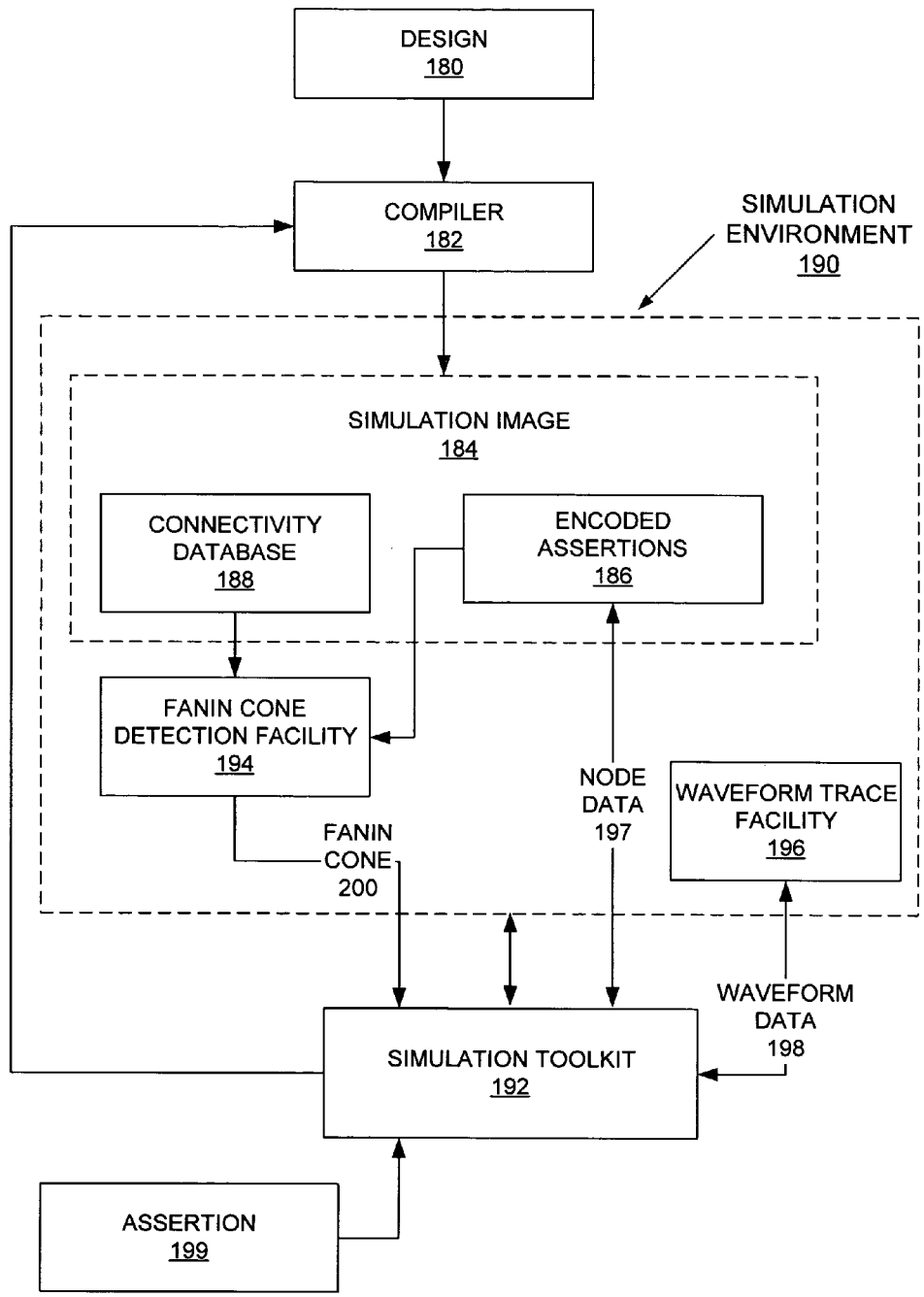
FIG. 6 shows a system for design simulation in accordance with an embodiment of the invention.

A system for facilitating dynamic modification of assertions and obtaining node data during simulation is shown in FIG. 6. The system includes a design (180) (e.g., a simulation design), a compiler (182), a simulation image (184) that includes encoded assertions (186) and a connectivity database (188), a simulation environment (190), a simulator toolkit (192), a fanin cone detection facility (194), a waveform trace facility (196), one or more assertions (199) and one or more fanin cones (200).

The design (e.g., Verilog modules) (180) is compiled by the compiler (182), which generates the simulation image (184), including the encoded assertion(s) (186), the connectivity database (188), and the simulation image (184). The simulation image (184) is a binary executable file including instructions for performing the simulation on the simulation environment (190). A simulator within the simulation environment (190) may operate on a variety of computers and platforms, such a Massively Parallel Processing (MPP) computer system, or on the computer shown in FIG. 5.

The simulation toolkit (192) is software used by a designer, including functionality to control the simulation environment, obtain the fanin cone (200), obtain waveform data (198), obtain the assertion (199), generate and analyze node data (197), debug failed encoded assertions, and generate and modify the encoded assertions (186) while the simulation is executing (i.e., runtime) or while the simulation is halted. The simulation toolkit (192) may execute on the same computer as a simulator (or on a different computer networked to the computer on which the simulation is executing). The simulation toolkit (192) includes appropriate functionality for interfacing with a designer. For example, the simulation toolkit (192) may include CLI and GUI tools.

An assertion (199) may be obtained by the simulation toolkit (192) using a command on the CLI or by accessing a file containing the assertion (199) using a GUI tool. In one embodiment of the invention, the assertion (199) is loaded into the simulation toolkit (192) after being compiled. However, in accordance with an embodiment of the invention, if the assertion (199) is only a single command, compilation of the assertion (199) may not be necessary and the encoded assertion (186) is not defined.

Each encoded assertion (186) is defined using the information (e.g., node data (197)) contained within the simulation toolkit (192) to assert a value of a particular circuit element (or elements) of the design (180) and the simulation image (184) at a particular point of the simulation. The encoded assertions are made available to the simulation environment (190), for example, via hooks generated into the simulation image (184) based on information provided by the simulation toolkit (192) or as a binary file that is created by the designer and saved to an appropriate location for use by the simulation environment (190). New and modified assertions generated during the simulation, in accordance with an embodiment of the invention, are hooked into the simulation image during simulation as encoded assertions (186).

The encoded assertions (186) may be associated with both combinational and sequential logic of the design. Those skilled in the art will appreciate that encoded assertions associated with sequential logic ("sequential assertions") may involve state device (i.e., "state machine") considerations. Thus, for sequential assertions, additional functionality (such as directives, instructions, programming language code, etc.) may be added to the design in order generation of a state device to allow debugging of failed sequential assertions. For example, if the assertion is a complex sequential assertion, such as:

when cycle == current_cycle + 2 var 1 == var2 [current_cycle − 2] AND vara3 [current_cycle], the assertion is re-written and stored in a form that meets a specification defined by a specific compiler. The compiler is then able to understand the assertion.

The simulation toolkit (192) includes appropriate libraries for communicating with the compiler (182), the simulation environment (190), and for converting data obtained in multiple formats. For example, the waveform trace facility (196) and the fanin cone detection facility (194) may provide data, in binary formats and third party formats (e.g., SignalScan or .vcd files) accessible through the simulation toolkit (192).

The connectivity database (188), in accordance with an embodiment of the invention, provides connectivity descriptions for nodes of the design (180) and the simulation image (184) by providing a binary description of how nodes of the design (180) and the simulation image (184) are connected. For example, circuit elements (such as gates) may be represented as nodes in a directed graph, with inputs and outputs of the nodes represented as edges in the directed graph. In accordance with an embodiment of the invention, the connectivity database (188) resides on the simulation environment (190) with the simulation image (184).

The fanin cone detection facility (194) obtains a fanin cone (200) for each of the encoded assertions (186). In order to obtain the fanin cone (200), the fanin cone detection facility (194) uses the connectivity database (188) in order to determine connectivity, i.e., which nodes of the design (180) are drivers for each assertion of the encoded assertions (186). In accordance with an embodiment of the invention, the fanin cone detection facility (194) is software that uses appropriate tree traversal and/or graph theory algorithms well known to those skilled in the art, in order to trace the fanin cone (200). In accordance with an embodiment of the invention, the fanin cone detection facility (194) obtains the fanin cone (200) for each assertion during a previous execution of the simulation.

The node data (197) is used to debug assertion failures, thus facilitating improvement of the design (180). The simulation toolkit (192) uses the fanin cone (200) for a failed assertion to select the node data (198) from waveform data (198) generated by the waveform trace facility (196) for the failed assertion. The waveform data (198) includes a history of signal values for nodes of the simulation image (184) during the simulation. The fanin cone (200) is used by the simulation toolkit (192) to select signals (i.e., waveforms) for drivers of nodes associated with failed encoded assertions. Such selected signals are the node data (197), which is used by a designer to debug failed encoded assertions.

In accordance with an embodiment of the invention, the node data (197) is minimal, meaning that waveform data (198) not associated with drivers of failed assertion nodes are not included in the node data (197). In accordance with an embodiment of the invention, while the waveform data (198) is generated during a previous execution of the simulation environment, the node data (197) for each assertion is obtained during an execution of the simulation. Thus, the node data (197) is available for the simulation toolkit (192) and the designer for debugging failed encoded assertions.

In accordance with an embodiment of the invention, the fanin cone detection facility (194) and the encoded assertions (186) are not included as part of the simulation image (184), but instead reside in a location accessible to the simulation environment (190) and the simulation toolkit (192), e.g., on a server connected by a network to the simulation environment (190) and the simulation toolkit (192).

Figure 7:
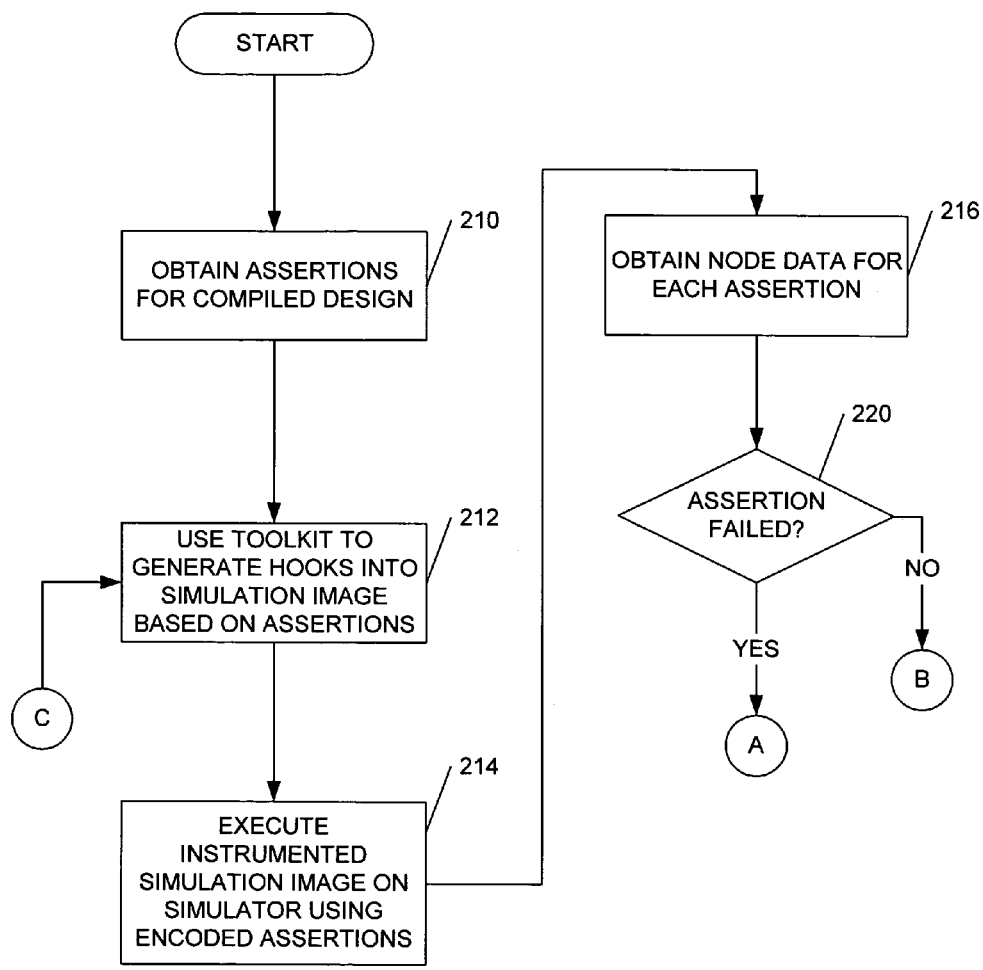
FIG. 7 shows a first part of a flowchart for a simulation using assertions to verify a design in accordance with an embodiment of the invention.
Figure 8:
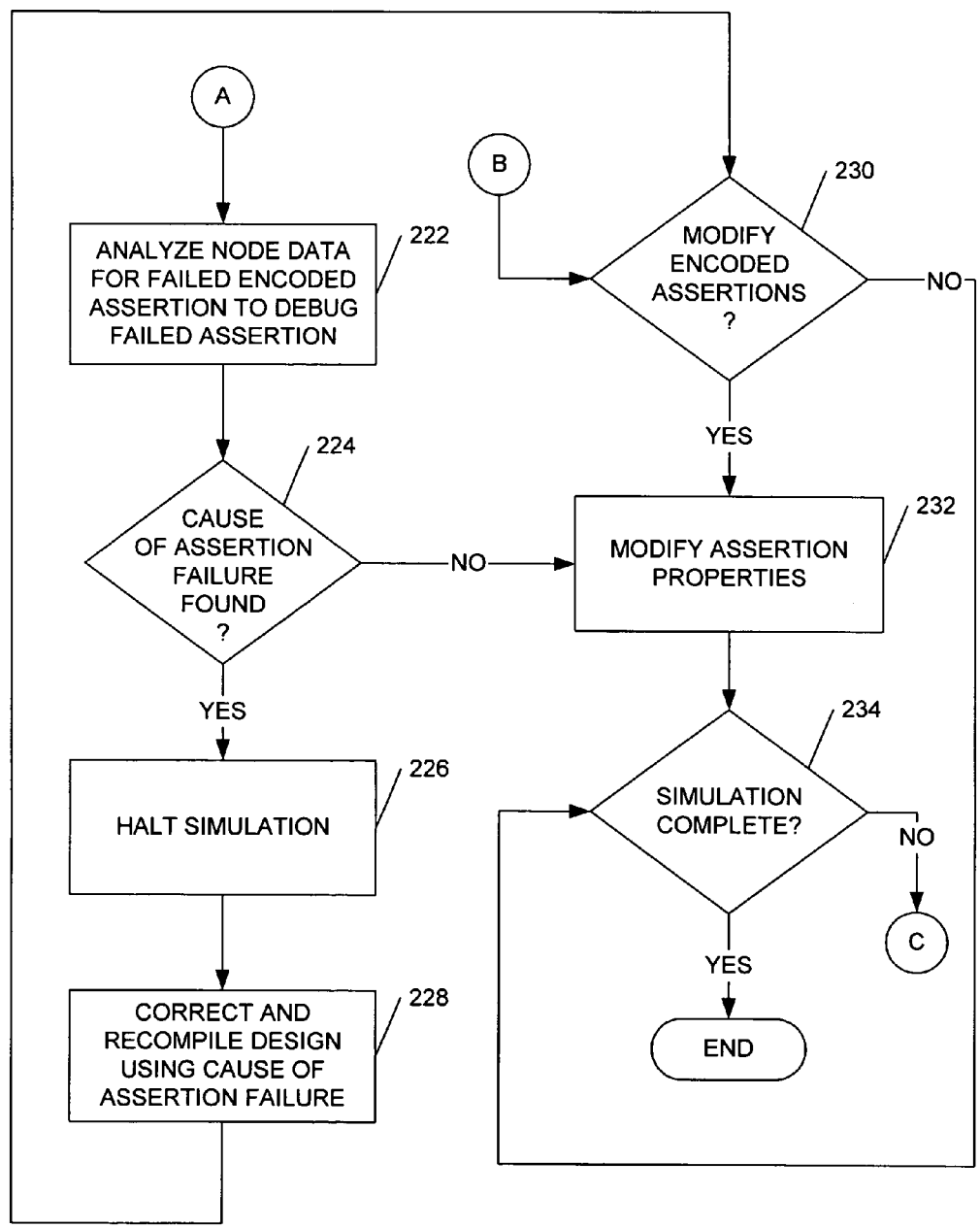
FIG. 8 shows a second part of a flowchart for a simulation using assertions to verify a design in accordance with an embodiment of the invention.

FIGS. 7 and 8 show a flowchart for a simulation using encoded assertions to verify a simulation design. Initially, assertions are obtained for the compiled design (Step 210). For example, the assertions defined using VHDL (or any other HDL that includes assertions constructs) may be obtained via a command line entry or as a stored file including multiple assertions. In an embodiment of the invention, the compiled design (i.e., simulation image) is created prior to obtaining the assertions. The compiled design is typically written by a designer using industry-standard tools, such as vi or emacs, etc., and saved as one or more files, which are accessible to a compiler.

Figure 2:
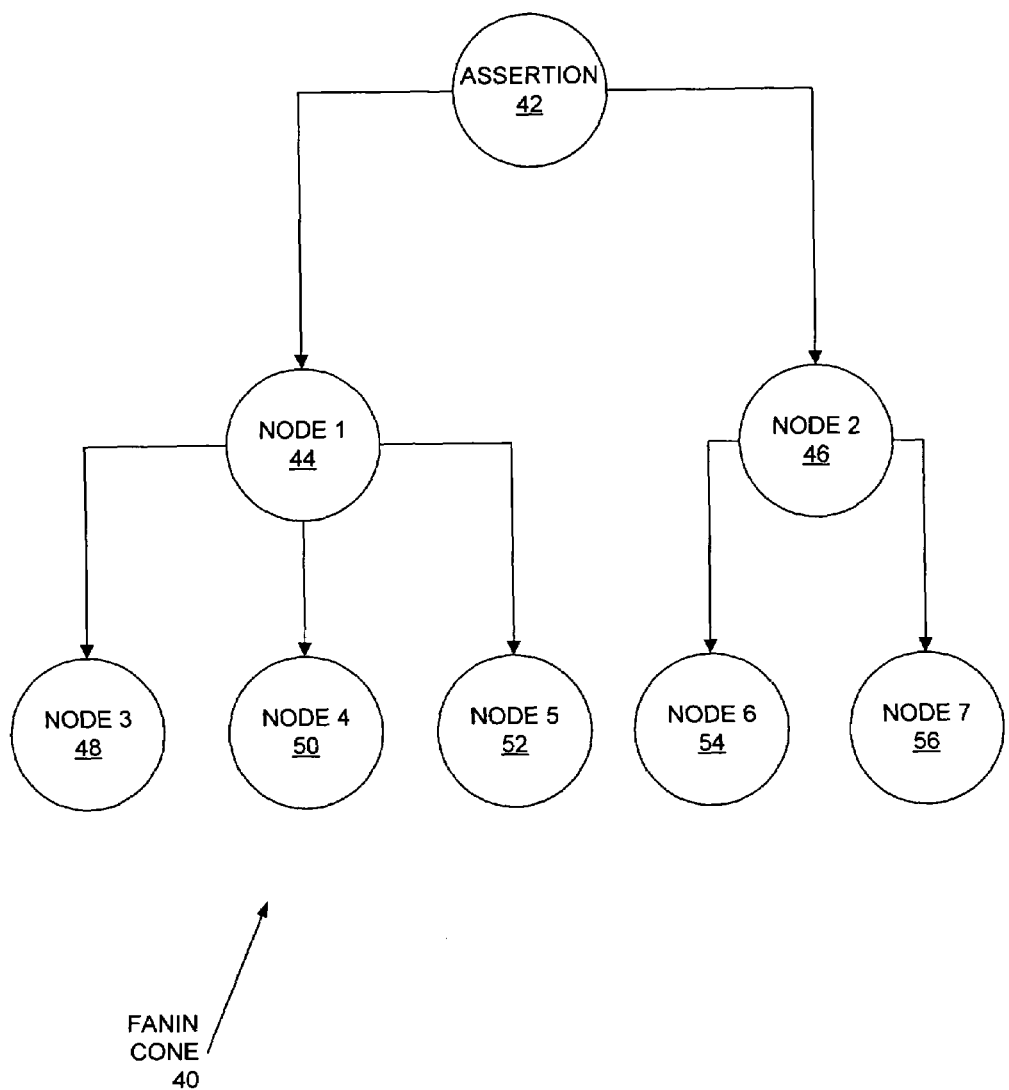
FIG. 2 shows a fanin cone for an assertion.
Figure 3:
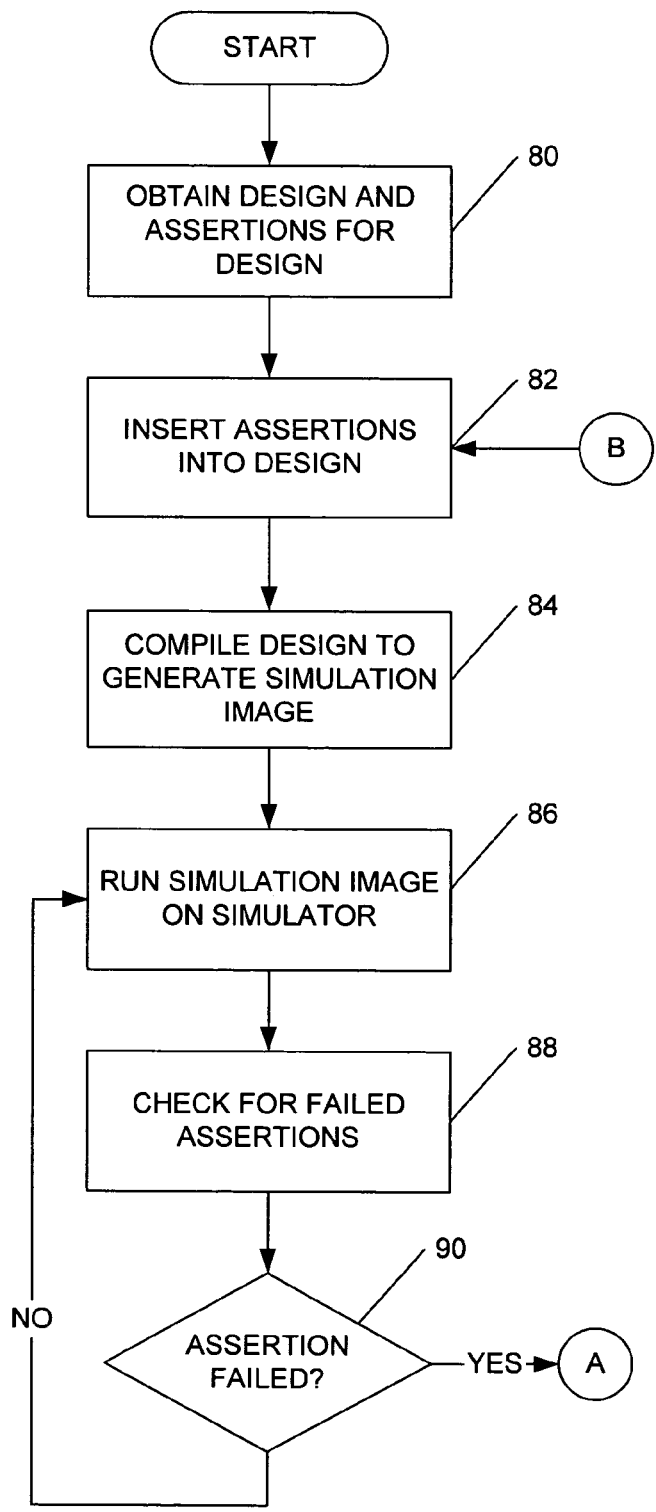
FIG. 3 shows a first part of a flowchart for a simulation using the system to verify a design.
Figure 4:
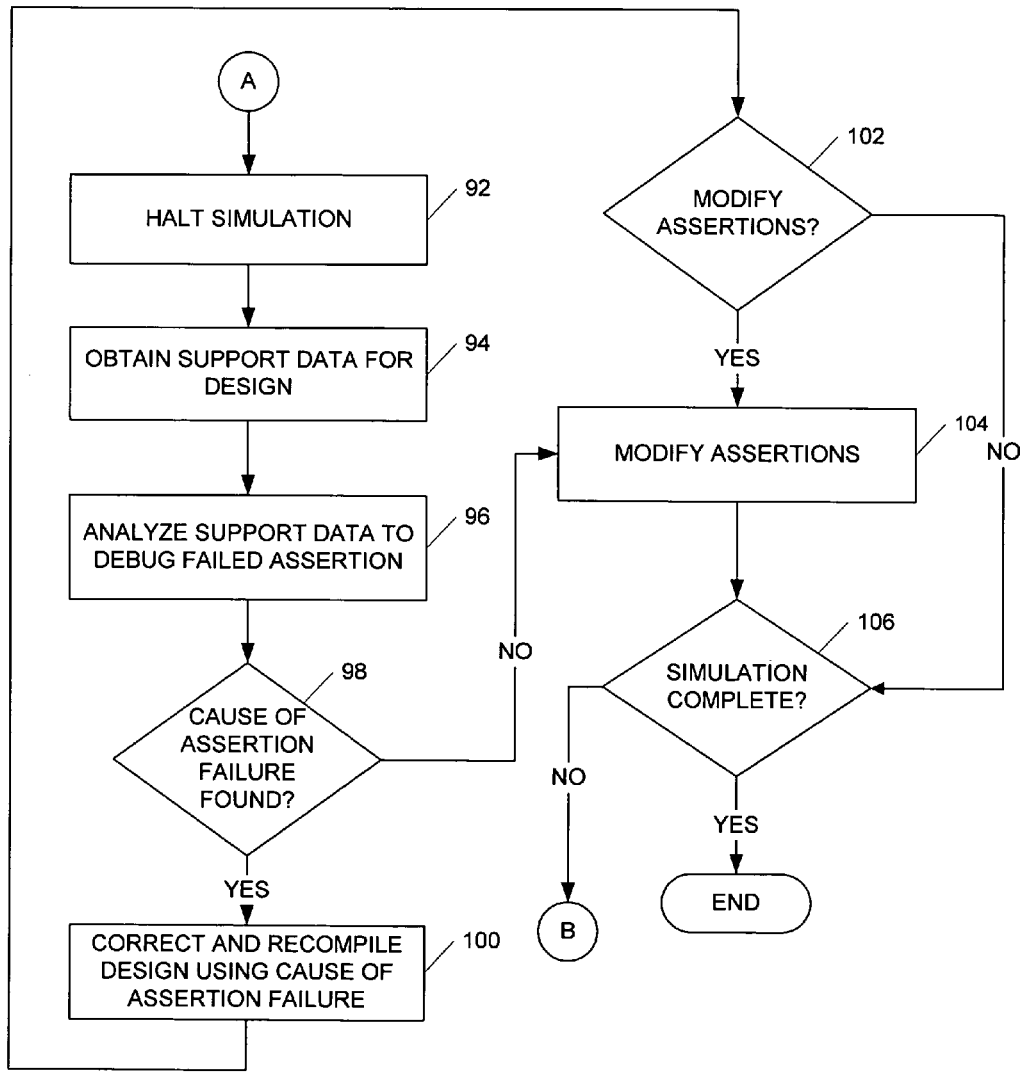
FIG. 4 shows a second part of a flowchart for a simulation using the system to verify a design.

Next, a simulation toolkit is used to generate hooks into the simulation image based on the obtained assertions (Step 212). The waveform trace facility generates waveform data as input into the simulation toolkit. The waveform data includes a history of signal values for nodes of the simulation image during the simulation. The fanin cone is used by the simulation toolkit to select signals (i.e., waveforms) for drivers of nodes associated with assertions. Such selected signals are the node data. For example, an assertion may be associated with AND gate, and the fanin cone detection facility finds each driver for the AND gate, tracing drivers back to primary inputs (leaf nodes). Referring back to FIG. 2, in order to obtain node data for the assertion (42), a history of signals (waveforms) is obtained for each of nodes 1 (44) through node 7 (56). The waveforms are obtained from the waveform data. In accordance with an embodiment of the invention, waveforms for other nodes (non-driver nodes) from the simulation image are not included as part of the node data Based on the assertions, the fanin cone, and waveform data, hooks are generated into the simulation image using well-known programming techniques. After the hooks are generated into the simulation image, the simulation image is considered "instrumented." The hooks into the instrumented simulation allow dynamic access to the nodes during the simulation without the need to re-compile the simulation design and create a new simulation image.

The instrumented simulation image is then loaded onto a simulator and executed within a simulation environment (Step 214). Next, while the simulation is executed, the hooks into the instrumented simulation image obtain node data as defined by each assertion (Step 216).

During simulation, the simulator checks for failed encoded assertions on a continuous basis (Step 220). For example, if a particular assertion asserts that a particular value is equal to "1" at the end of the $500^{th}$ cycle of the simulation, and the actual value during the simulation is equal to "0" at the end of the $500^{th}$ cycle of the simulation, then the assertion is a failed assertion.

As shown in FIG. 8, if an encoded assertion has failed, the designer analyzes the node data to debug (i.e., determine the cause of) the failed encoded assertion (Step 222). For example, the designer may determine that a particular gate associated with a node in the fanin cone is faulty, which caused an unexpected signal value, resulting in the failed encoded assertion. The node data is used to determine the cause of the encoded assertion failure. The node data includes specific values of signals on nodes at particular points of the fanin cone at particular points in the simulation.

Next, a determination is made as to whether the cause of the encoded assertion failure is found (Step 224). If the cause of the encoded assertion failure is found, the simulation is halted (Step 226), and the design is corrected and recompiled using the simulation toolkit, taking into consideration the cause of the assertion failure (Step 228). In accordance with an embodiment of the invention, the simulation continues rather than halting and the designer is notified by an alert (such as an e-mail or alarm), allowing for correction of the design occurs later.

Then, a determination is made as to whether encoded assertions require modification (Step 230). If the encoded assertions require modification (i.e., designer wants to modify the encoded assertions or add new encoded assertions), the encoded assertions are modified (Step 232). As discussed above, the nature of the encoded assertion being instrumented into the simulation using hooks allows this modification to be performed dynamically (i.e., during runtime of a simulation and without re-compiling the instrumented simulation design). Once the encoded assertions are modified (or if modification in Step 230 is not required), a determination is made as to whether the simulation has completed (Step 234). If the simulation has not completed, Step 214 (see FIG. 7) is performed; otherwise, the simulation ends.

Referring back to Step 224 of FIG. 8, if the cause of encoded assertion failure is not found, then the designer modifies the encoded assertions as described above (Step 232), and if the simulation is determined to not be complete (Step 234), the simulation continues without halting simulation (Step 214 in FIG. 7).

Referring back to Step 220, if there is no failed encoded assertion while the design is being executed within the simulation environment, Step 230 of FIG. 8 is performed. If the designer wishes to modify the encoded assertions, the designer may use the simulation toolkit to modify the encoded assertions or insert the new encoded assertions into the design as described above (Step 232).

Those skilled in the art will appreciate that the steps shown in FIGS. 7 and 8 may differ according to implementation. For example, decision blocks such as Steps 220 and 234 may represent operations that occur asynchronously, or "on demand" in accordance with the designer's directives. For example, the designer may wish to modify or add a new encoded assertion as soon as the simulation begins, instead of later, as shown in FIG. 8.

The present invention offers the following advantages. Because fanin cones may be traced for each assertion prior to a failed assertion, and because node data for each assertion may be obtained prior to a failed assertion, debugging failed encoded assertions is expedited. Debugging failed encoded assertions is expedited because the node data (typically including a minimal amount of data) for the failed encoded assertions is available without the designer having to trace a fanin cone and obtain the node data. Thus, verification of the design is expedited.

Further, because the simulation toolkit has functionality to modify the encoded assertions and add new encoded assertions, the simulation does not have to be halted, and the design does not need to be recompiled when new encoded assertions are added. Thus, verification of the design is expedited.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for tracing a simulation design comprising:
   an encoded assertion asserting a value of a node of the simulation design at a point in a simulation;
   a fanin cone detection facility configured to obtain a fanin cone for the encoded assertion;
   a waveform trace facility configured to obtain waveform data comprising a history of signal values for the node; and
   a simulation toolkit configured to:
      obtain node data using the fanin cone and the waveform data; and
      generate a hook into the simulation to obtain an instrumented simulation, wherein the hook is generated based on the encoded assertion, the fanin cone, and the waveform trace.

2. The system of claim 1 further comprising:
   a connectivity database comprising a connectivity description for the node.

3. The system of claim 2, wherein the connectivity database is used to obtain the fanin cone.

4. The system of claim 3, wherein the connectivity database resides within a simulation environment.

5. The system of claim 1, wherein the fanin cone detection facility is configured to obtain the fanin cone prior to execution of the simulation environment.

6. The system of claim 1, wherein the waveform trace facility is configured to obtain the waveform data prior to execution of the simulation environment.

7. The system of claim 1, wherein the node data is obtained during execution of the simulation.

8. The system of claim 1, wherein the node data is obtained using the hook.

9. The system of claim 1, wherein the fanin cone detection facility provides fanin cone information in a binary format.

10. The system of claim 9, wherein the binary format facilitates a third party format of the node data.

11. The system of claim 1, wherein the assertion is a sequential assertion.

12. The system of claim 11, wherein the simulation design comprises a specification for a compiler to understand the sequential assertion.

13. The system of claim 1, wherein the encoded assertion is modified while the simulation is executing.

14. A method of tracing a simulation design comprising:
   obtaining an assertion for a simulation image of the simulation design;
   generating hooks into the simulation image using a simulation toolkit to obtain an instrumented simulation image, wherein the hooks are generated based on the assertion, a fanin cone, and waveform data; and
   executing the instrumented simulation image in a simulation environment to obtain node data from the assertion.

15. The method of claim 14, further comprising:
   debugging a failure of the assertion using the node data.

16. The method of claim 15, wherein the debugging is performed while simulation is executing.

17. The method of claim 14, further comprising:
   modifying the assertion during execution of the simulation environment.

18. The method of claim 14, wherein obtaining the fanin cone occurs prior to the execution of the simulation environment.

19. The method of claim 14, wherein obtaining the waveform data occurs prior to the execution of the simulation environment.

20. The method of claim 14, wherein obtaining the fanin cone comprises tracing the fanin cone using a connectivity database.

21. The method of claim 14, wherein the assertion is a sequential assertion.

22. The method of claim 21 further comprising:
   generating a directive for the design to obtain a state device for the sequential assertion.

23. A computer system for tracing a simulation design comprising:
   a processor;
   a memory;
   a storage device; and
   software instructions stored in the memory for enabling the computer system to:
      obtain an assertion for a simulation image of the simulation design;
      generate hooks into the simulation image using a simulation toolkit to obtain an instrumented simulation image, wherein the hooks are generated based on the assertion, a fanin cone, and waveform data; and
      execute the instrumented simulation image in a simulation environment to obtain node data from the assertion.

24. The computer system of claim 23 further comprising:
   software instructions to debug the failure of the assertion using the node data.

25. The computer system of claim 23 further comprising:
   software instructions to modify the assertion during the execution of the simulation.

26. An apparatus for tracing a simulation design comprising:
   means for obtaining an assertion for a simulation image of the simulation design;
   means for generating hooks into the simulation image using a simulation toolkit to obtain an instrumented simulation image, wherein the hooks are generated based on the assertion, a fanin cone, and waveform data;
   means for executing the instrumented simulation image in a simulation environment to obtain node data from the assertion; and
   means for debugging the failure of the assertion using the node data.

* * * * *